(12) United States Patent
Takahashi

(10) Patent No.: US 6,320,250 B1
(45) Date of Patent: Nov. 20, 2001

(54) SEMICONDUCTOR PACKAGE AND PROCESS FOR MANUFACTURING THE SAME

(75) Inventor: Yoshikazu Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/478,491

(22) Filed: Jan. 6, 2000

(30) Foreign Application Priority Data

Jun. 29, 1999 (JP) .................................................. 11-183120

(51) Int. Cl.⁷ ............................. H01L 23/02; H01L 23/52
(52) U.S. Cl. ........................ 257/678; 257/693; 257/686; 257/723; 257/780; 257/781; 257/792
(58) Field of Search ..................................... 257/737, 678, 257/693, 686, 792, 781, 786, 723, 780; 438/613, 106, 109

(56) References Cited

U.S. PATENT DOCUMENTS

| | | | |
|---|---|---|---|
| 5,945,741 | * 8/1999 | Ohsawa et al. | 257/778 |
| 6,107,678 | * 8/2000 | Shigeta et al. | 257/669 |
| 6,204,564 | * 3/2001 | Miyata et al. | 257/778 |
| 6,246,114 | * 6/2001 | Takahashi et al. | 257/696 |

* cited by examiner

*Primary Examiner*—Jhihan B Clark
(74) *Attorney, Agent, or Firm*—Volentine Francos, PLLC

(57) ABSTRACT

The present invention provides a semiconductor package, the package comprising: a base substrate having a perforation formed therein, the perforation including a bottom and the base substrate including a backface; an electrode portion secured to the backface of the base substrate and disposed on the bottom of the perforation; a semiconductor device electrically connected to the electrode portion and disposed on the backface of the base substrate; a sheet elastic body interposed between the semiconductor device and the electrode portion; and leveling means between the sheet elastic body and the electrode portion for eliminating gaps along the electrode portion. In the semiconductor package neither deformation nor cracks of the package will be produced even if heat history is applied during packaging and the package density can be improved. The present invention further provides a process for the production of the semiconductor package.

14 Claims, 10 Drawing Sheets

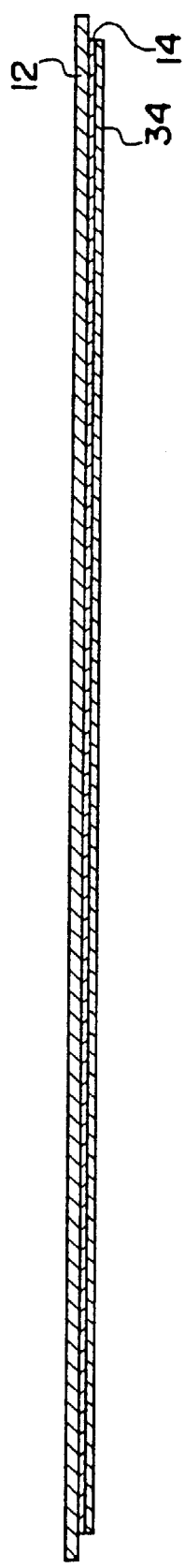
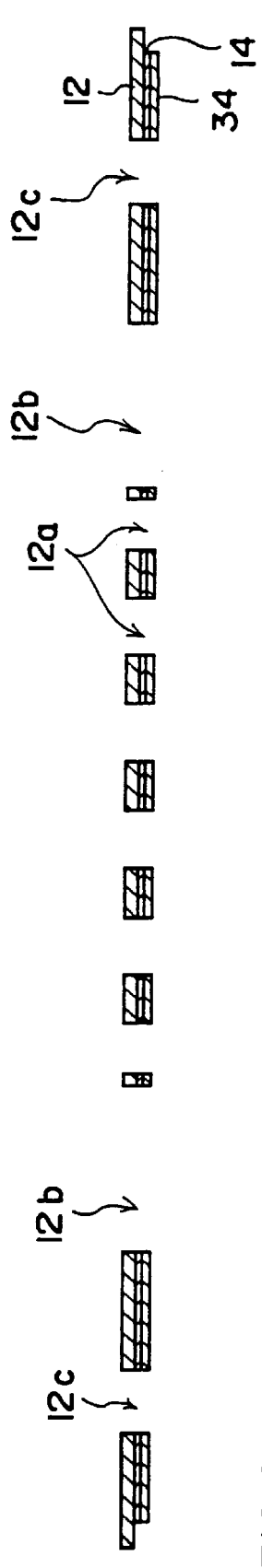
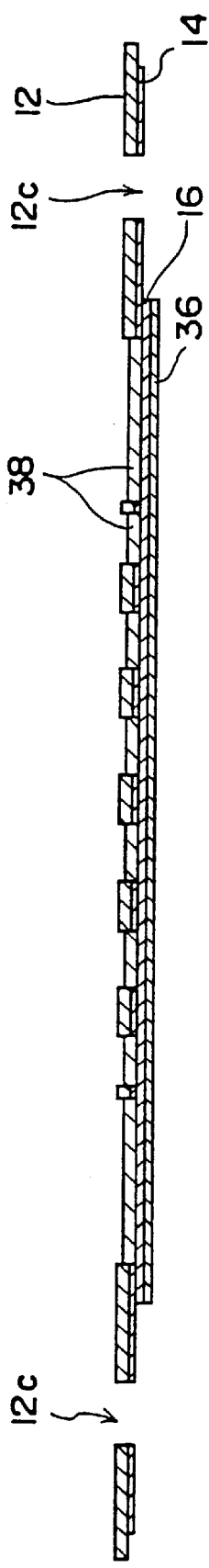

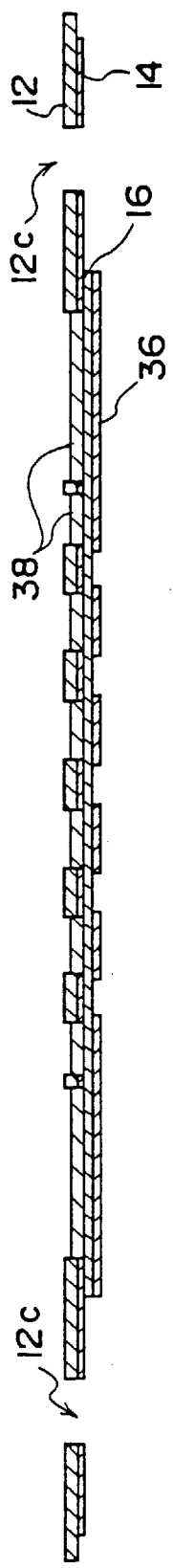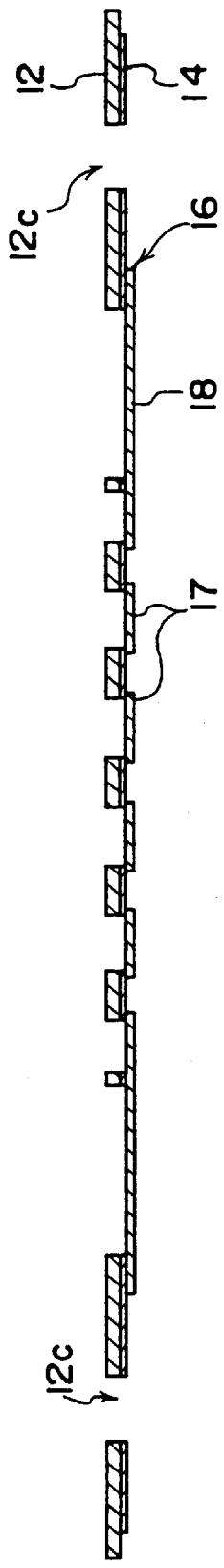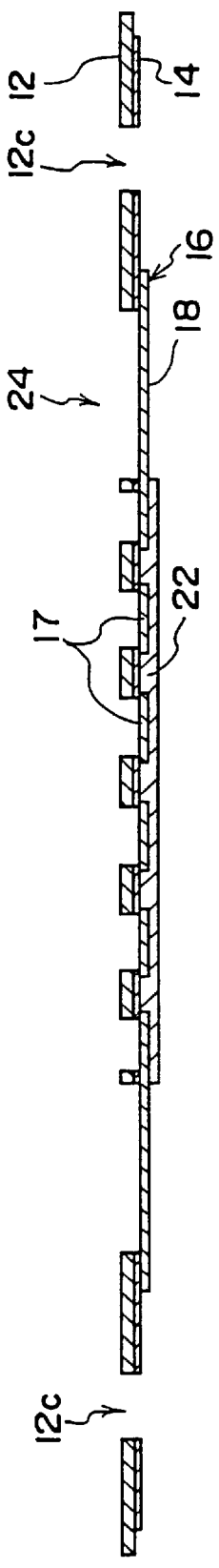

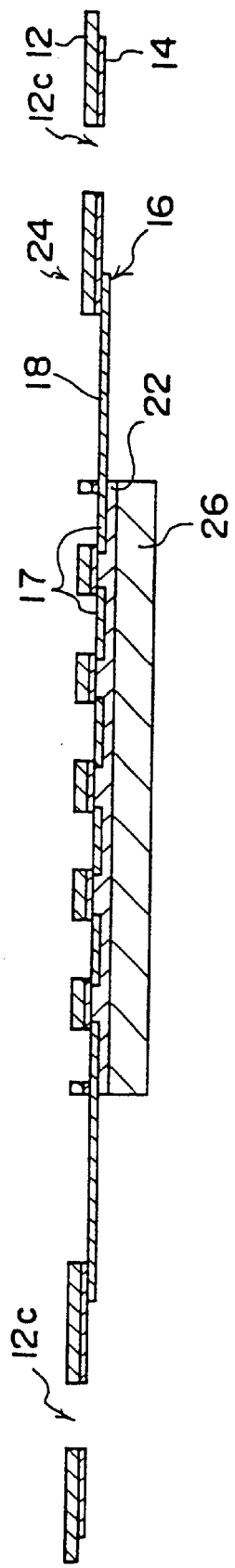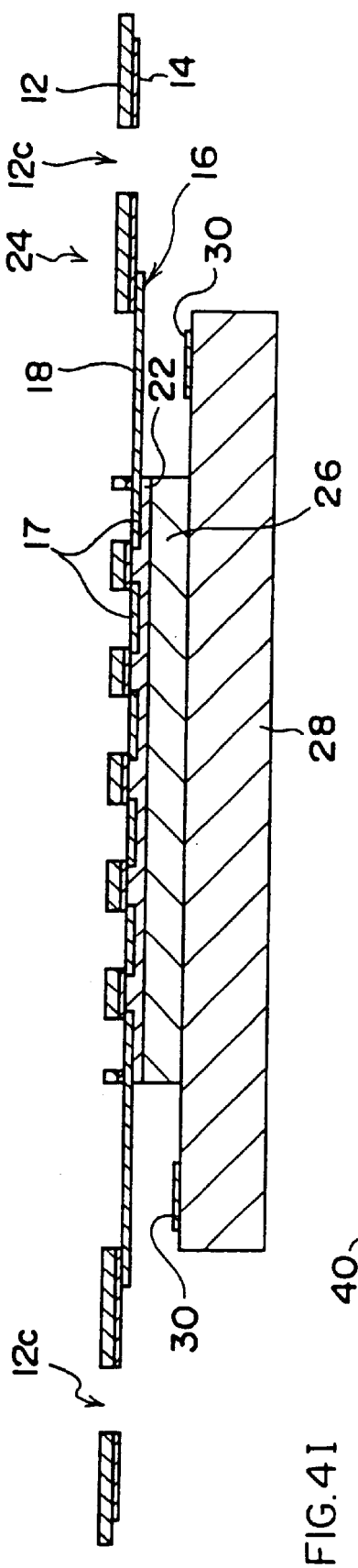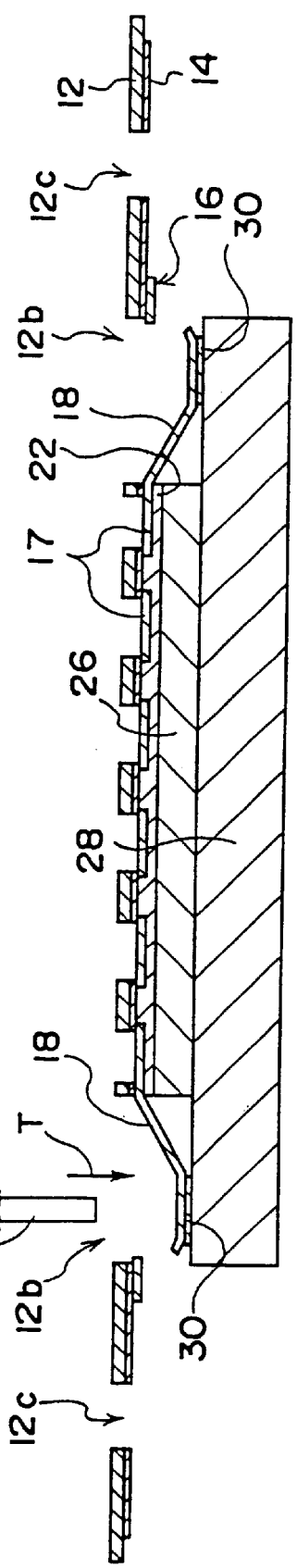

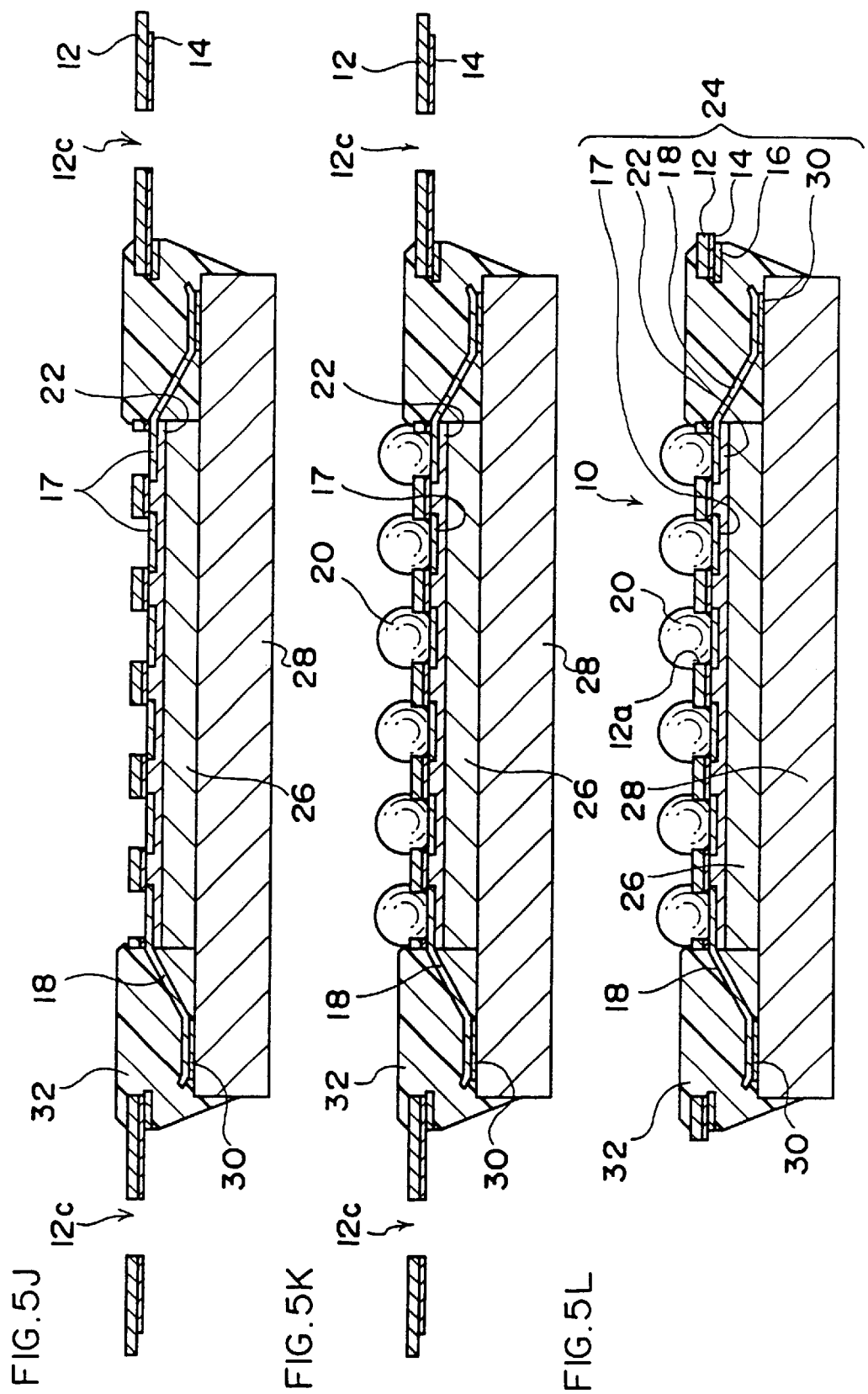

SEMICONDUCTOR PACKAGE AND PROCESS FOR MANUFACTURING THE SAME

BACKGROUND OF THE INVENTION

1. Field of the Invention

The present invention relates to a semiconductor package and a process for manufacturing the same, and, particularly, to a surface mounting semiconductor package and a process for manufacturing the same.

2. Description of the Related Art

As examples of conventional semiconductor packages having a ball grid array (hereinafter abbreviated as "BGA") structure using a tape carrier, those having the structure shown in FIG. 10 are given.

As shown in FIG. 10A, a semiconductor package 100 comprises a plurality of lands 17 (electrodes) formed in an array along four sides of the surface side of a substrate each land having a solder ball 20 (external connection terminal) mounted on the top face thereof; a base substrate 12 (polyimide film) to whose bottom face is adhered a patterned copper foil 16 using an insulating adhesive 14; an adhesive sheet elastomer 26 (elastic body) adhered to the exposed portions of the bottom face of the insulating adhesive 14 and to the lands 17; a semiconductor device 28 which is loosely secured to the bottom face of the elastomer 26 and bonded to a plurality of electrode pads 30 having an inner lead 18, extending from the land 17, on the peripheral portions of its upper face; and an insulating resin 32 protecting the inner lead 18 and the bonded portion.

Note that the base substrate 12, the insulating adhesive 14, the copper foil 16, the lands 17 and the inner lead 18 there are generically called a tape carrier 25.

SUMMARY OF THE INVENTION

In the aforementioned semiconductor package having the BGA structure, however, in the case where the assembly conditions are bad or an inadequate elastomer material is used, the elastomer 26 adhering to the bottom face of the base substrate 12 partially peels off around the circumference of the lands 17 with the result that, as shown in FIG. 10B, a space 102 enclosed by the bottom face of the insulating adhesive 14, the side faces of the land 17, and the elastomer 26 is produced. Therefore, water, air and the like collected in the space 102 expand on account of historical heat history and the like when the semiconductor device is mounted on a mother board, giving rise to the problem of a package deforming and cracks being produced.

In recent years, with the progress in the miniaturization of electronic equipment, there has been a demand for smaller semiconductor packages. The above semiconductor package, however, has the structure in which one semiconductor device is provided in one package. When there is a need, in equipment using this type of package semiconductor, for example, for a semiconductor device having a different function or for a plurality of semiconductor devices even if they are of the same type, then naturally, the necessary number of semiconductor devices are mounted and the space to be occupied by the packages of each semiconductor package and by the connection terminals thereof needs to be provided. Hence, it has been desired to reduce this space thereby improving the packaging density of semiconductor packages.

In consideration of the above, an object of the present invention is to provide a method for producing semiconductor package in which deformation of the package and cracking do not occur even when heat history is applied during the packaging, and which further provides an improved packaging density during packaging, compared to the conventional structure.

According to a first aspect of the present invention, there is provided a semiconductor package, the package comprising:

a base substrate having a perforation formed therein, the perforation including a bottom and the base substrate including a backface;

an electrode portion secured to the backface of the base substrate and disposed on the bottom of the perforation, wherein a gap exists between the base substrate and the electrode portion;

a semiconductor device electrically connected to the electrode portion and disposed on the backface of the base substrate;

a sheet elastic body interposed between the semiconductor device and the electrode portion; and a leveling material filling the gap between the base substrate and the electrode portion.

Specifically, in the present invention, the leveling material for eliminating a step between the base substrate and the electrode portions is provided in the gap which is produced in the backface portion of the base substrate by the electrode portions, thereby eliminating a step which is formed on the backface portion of the base substrate. This makes the backface portion of the base substrate smooth and hence no gap is produced at the contact section of the sheet elastic body which is to be brought into surface contact with the smoothed surface. Also, even if this elastic body is adhesive, no partial peeling force is produced at the joint surface.

In the above structure, there is neither gap nor space produced by partial peeling at the contact surface or joint surface between the backface portion of the base substrate and the elastic body. Therefore, even if heat history is applied in the packaging, the package is not deformed and no cracks are produced.

In a second aspect of the semiconductor package according to the first aspect, preferably the base substrate is a polyimide film and the leveling material is an insulating coating agent.

Specifically, in the second aspect, since the leveling material is a coating agent, the gaps on the backface portion of the base substrate can be reliably filled. Accordingly, gaps are not left on the backface portion of the base substrate but are reliably filled and any step on the backface portion of the base substrate is eliminated. In addition, since the coating agent is insulated, short circuiting across the electrode portions through which current flows can be avoided.

In a third aspect of the semiconductor package according to the first aspect, preferably the semiconductor package comprises: the base substrate: electrode portions formed on the base substrate; and a plurality of semiconductor devices connected electrically to the electrode portions and connected to the base substrate.

In the third aspect, the semiconductor package is provided with a plurality of semiconductor devices, which are electrically connected to each other. In other words, the semiconductor package has a structure in which the plurality of semiconductor devices are arranged in the same package and share the package and the electrode portions.

Accordingly, the packaging space is reduced as compared with the case of packaging, within a given area, a plurality of semiconductor packages having the conventional structure in which one semiconductor device is stored in one package. Specifically, as compared with the semiconductor package having the conventional structure, the outside dimension is substantially reduced and the packaging density in packaging is thereby improved.

In a fourth aspect of the semiconductor package according to the third aspect, the plurality of semiconductor devices are connected to the base substrate in a stacked arrangement.

In the fourth aspect of the semiconductor package, when the plurality of semiconductor devices are stacked, each semiconductor device is stacked in the direction of the thickness thereof and hence the outside dimension in the direction of the packaged plane of the semiconductor package is reduced as compared with the case of placing each semiconductor device side by side on the same plane. Therefore, the packaged area is reduced to be less than in conventional arrangements in which semiconductor packages are placed side by side on a planar material such as a substrate.

In a fifth aspect of the semiconductor package according to the fourth aspect, the stacked arrangement includes a top semiconductor device on which the electrode portion is disposed, and each semiconductor device is electrically connected directly to the electrode portion.

In the fifth aspect of the semiconductor package, each of the plurality of stacked semiconductor devices is electrically connected directly to an electrode portion arranged on the top semiconductor device. Specifically, since semiconductor devices are connected to each other only by the electrode portions, the electrical connections required between the semiconductor devices are attained through the connection to the same electrode portion.

This makes it possible to avoid the necessity of a complicated bridge-like connection made between semiconductor devices and hence a simple connection method and connection structure in which each semiconductor device is only connected to the electrode portion can be achieved.

In the sixth aspect of semiconductor package according to the third aspect, the plurality of semiconductor devices are connected to the base substrate in a planar arrangement.

When semiconductor devices are placed on the same plane, the semiconductor package can be made thinner than in the case of the stacked arrangement, and the packaged area is reduced to be even less than in conventional arrangements in which each semiconductor device is packaged by arranging it on a plane substrate. When this invention is applied to, for example, a thin equipment, the package density is improved over that of semiconductor package having conventional structures.

According to another aspect of the present invention, there is provided a method of manufacturing a semiconductor package, the method comprising the steps of:

forming a base substrate having a perforation therein;

forming an electrode portion;

disposing the electrode portion on the base substrate, using an insulation layer between the base substrate and the electrode portion, wherein the insulation layer fills gaps between the base substrate and the electrode portion;

providing an external connecting terminal by leaving the electrode portion exposed through the perforation; electrically connecting a semiconductor device to the external connecting terminal; and interposing a sheet elastic body between the semiconductor device and the electrode portion.

In the method of manufacturing a semiconductor package according to this aspect, after the electrode portions have been formed on the backface of the base substrate, an insulation layer is formed for eliminating the step created by the electrode portions between the substrate backface and the electrode portions. On the backface of the base substrate which is smoothed by means of this insulated layer, specifically, between the insulation layer and the semiconductor device, the sheet elastic body is interposed.

Therefore, gaps and the like are not produced at the contact portion of the sheet elastic body which is in surface contact with the smoothed insulation layer. Even when the elastic body is adhesive, no partial peeling force is produced at the joint surface between the elastic body and the insulation layer. Hence, neither gap nor space produced by partial peeling are observed at the contact surface or joint surface between the backface of the base substrate and the elastic body. Therefore, even if historical heat history is applied in packaging, the package is not deformed and cracks are not produced in the package.

BRIEF DESCRIPTION OF THE DRAWINGS

FIGS. 2A, 2B and 2C are views explaining a method for the production of a tape carrier portion according to the first embodiment of the present invention, wherein FIG. 2A shows a state where an elongated base substrate which is to become a material used for a tape carrier is set, FIG. 2B shows the a state where a base substrate has undergone a hole forming process, and FIG. 2C shows a state where a photosensitive resist and a back coating material have been applied to the base substrate.

FIGS. 3D, 3E and 3F are views explaining the method for the production of a tape carrier portion according to the first embodiment of the present invention, wherein FIG. 3D shows a state where a circuit pattern has been formed on the photosensitive resist by exposure and developing, FIG. 3E shows a state where a copper foil of the base substrate has been etched to form a land and inner lead, and FIG. 3F shows a state where solder resist has been applied to the land and a part of the inner lead to complete the tape carrier.

FIGS. 4G, 4H and 4I are views explaining the process for the production of a semiconductor package with a BGA structure according to the first embodiment of the present invention, wherein FIG. 4G shows a state where an elastomer has been adhered to the solder resist of the tape carrier, FIG. 4H shows a state where a semiconductor device has been loosely secured to the elastomer, and FIG. 4I shows a state where the inner lead has been connected to an electrode pad of a semiconductor device by inner bonding.

FIGS. 5J, 5K and 5L are views explaining the process for the production of a semiconductor package with a BGA structure according to the first embodiment of the present invention, wherein FIG. 5J shows a state where the inner lead and the inner bonding portion have been sealed with resin, FIG. 5K shows a state where solder balls have been mounted on the lands, and FIG. 5L shows a state where a portion of the product has been punched from the tape carrier to complete a semiconductor package with a BGA structure.

FIGS. 6A and 6B are views showing a semiconductor package with a BGA structure according to a second embodiment of the present invention, wherein FIG. 6A is a plan-view and FIG. 6B is a schematic sectional view along the line 6—6 of FIG. 6A.

FIGS. 7A and 7B are views showing a semiconductor package with a BGA structure according to a third embodiment of the present invention, wherein FIG. 7A is a plan view and FIG. 7B is a schematic sectional view along the line 7—7 of FIG. 7A.

FIGS. 9A and 9B are views showing the semiconductor package with a BGA structure according to the fourth embodiment of the present invention, wherein FIG. 9A is a schematic sectional view along the line 9a—9a of FIG. 8 and FIG. 9B is a schematic sectional view along the line 9b—9b of FIG. 8.

DETAILED DESCRIPTION OF THE PREFERRED EMBODIMENTS

Embodiments of the present invention will be hereinafter explained with reference to the drawings.

First Embodiment

Figure 1:
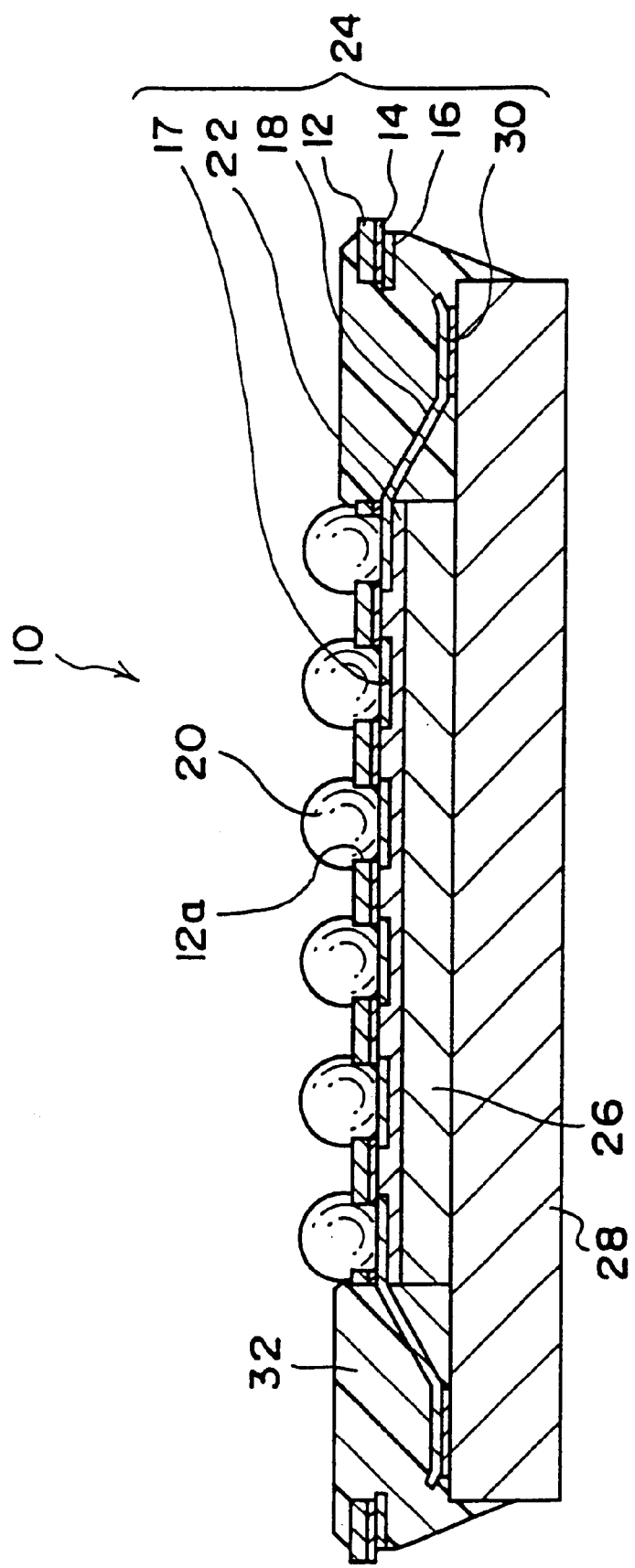
FIG. 1 is a schematic sectional view showing a state where solder resist is provided on the bottom face of a base substrate in a first embodiment of the present invention.

FIG. 1 shows a semiconductor package 10 with a BGA structure using a tape carrier according to a first embodiment of the present invention.

A semiconductor package 10 is provided with a base substrate 12 (polyimide film) having a plurality of ball-mounting holes 12a, and an insulating adhesive 14 is formed in a layer form on the bottom face of the base substrate 12. Patterned copper foil 16 and lands 17 (electrode portion), which are respectively arranged so as to seal an opening at the bottom face of each ball-mounting hole 12a, are adhered to the bottom face of the base substrate 12 by this insulating adhesive 14.

Inner leads 18 provided with gold plating extend downwards at an angle from each land 17 in a predetermined direction (left, right, front and backward directions in the figure). A solder ball 20 protruding upwards from the upper surface of the base substrate 12 is mounted on the upper surface of each land 17. When the semiconductor package 10 is surface-mounted on a circuit board or a mother board by a reflow process or the like, this solder ball 20 is fused with electrode lands formed on these boards to thereby function as a mechanical joint portion and electrical connecting portion between the semiconductor package 10 and each of these boards.

On the bottom face of the base substrate 12, solder resist 22 (leveling material) is formed around the side faces and bottom face of the lands 17 and around the exposed portion of the bottom face of the insulating adhesive 14. This solder resist 22 is formed, for example, by applying a liquid polyimide resin having insulation and heat resistance and by then heat-treating this until solid. Thus the side faces and bottom face of the lands 17 and the exposed portions of the bottom face of the insulating adhesive 14 are coated with the solder resist 22 made substantially in a film form and the lands 17 are in a protected state at the same time.

The solder resist 22 enters deep into all the gaps of the step portions and irregular portions which are formed by the lands 17 and closely adheres thereto so that the form of these portions is maintained. Note that the base substrate 12, the adhesive 14, the copper foil 16, the lands 17, the inner lead 18 and the solder resist 22 are generically called a tape carrier 24.

Moreover, the bottom face of the solder resist 22 becomes a smooth surface and the semiconductor device 28 is disposed under the semiconductor package 10 by being loosely secured to the bottom face of the tape carrier 24 by an elastomer 26 made of an adhesive elastic material which is adhered to the bottom face of the solder resist 22.

A plurality of electrode pads 30 are formed on the peripheral portions of the top surface of the semiconductor device 28 and a predetermined inner lead 18 is bonded to the corresponding electrode pad 30. Accordingly, the semiconductor device 28 is electrically connected to a substrate through the solder balls 20 used as external connecting terminals during packaging. The predetermined peripheral portions of the tape carrier 24 are sealed by the insulating resin 32 protecting the inner lead 18 and the bonded portion.

As described above, because the semiconductor package 10 of this embodiment is provided with the solder resist 22, which eliminates the step between the base substrate 12 and the land 17, between the base substrate 12 and the sheet elastomer 26, the step created by the land 17 formed on the bottom face of the base substrate 12 is eliminated. Also, since the solder resist 22 is formed from a coating agent, the gaps formed in the bottom face portion of the base substrate 12 are surely filled by the solder resist 22 and no gap is left unfilled.

Accordingly, no partial peeling force is produced at the adhesive surface of the elastomer 26 which is adhered to the bottom face of the smoothed base substrate 12, specifically, to the bottom face of the solder resist 22. As a consequence, no void caused by the partial peeling is produced on the adhesive surface, so that the package is not deformed and no crack is produced even if heat history is applied during the packaging.

It is needless to say that since the solder resist 22 has insulating characteristics, there is no short circuiting across the lands 17 through which current flows.

In this embodiment, the solder resist 22 is formed of a polyimide type resin which is the same type of materials as that used for the polyimide film on the base substrate 12. Therefore, the solder resist 22 has almost the same thermal expansion coefficient as the base substrate 12 and is hence resistant to the effect of thermal stress and the like. Even if heat history is applied, the solder resist 22 does not peel off the base substrate 12 and no gap is produced.

Various materials may be used for the solder resist 22 other than polyimide resins. For instance, the use of epoxy type resins is advantageous in that production costs can be kept down, because epoxy type resins are less expensive than polyimide type resins.

Next, a process for the production of the semiconductor package having the above structure will be explained with reference to FIG. 2A to FIG. 5L.

Firstly, as shown in FIG. 2A and FIG. 2B, necessary holes are opened using a metal mold or by etching in the base substrate 12 to the bottom face of which adhered a cover tape 34 using an insulating adhesive 14. These necessary holes include ball-mounting holes 12a for mounting the solder balls 20, bonding holes 12b for connecting the inner leads 18 to the electrode pad 30, and perforation holes 12c used for the positioning and conveyance of the base substrate 12.

Next, as shown in FIG. 2C, the cover tape 34 is peeled off and the copper foil 16 is adhered to the insulating adhesive 14. Subsequently, a photosensitive resist 36 is applied to the bottom face of the copper foil 16 and a back coating material 38 is applied to the top face of the copper foil 16.

Here, when the photosensitive resist 36 is exposed through a mask on which a circuit pattern has been printed and developed, a predetermined portion of the photosensitive resist 36 is dissolved by a developing solution to form a pattern (i.e., the concave portions) such as that shown in FIG. 3D. Further etching is performed to process the exposed portions of the copper foil 16 and the sensitive resist 36 and the back coating material 38 are peeled off. As a result, as shown in FIG. 3E, lands 17 and inner leads 18 are formed.

Moreover, as shown in FIG. 3F, the solder resist 22 (insulating layer) is applied to the lands 17 and a part of the inner leads 18. As the method of applying the solder resist 22, for example, a screen printing method may be used. Thus, the tape carrier 24 is completed.

FIGS. 4G, 4H and 4I and FIGS. 5J, 5K and 5L show the steps of producing the packaged semiconductor device having a BGA structure using the tape carrier 24 and the semiconductor device 28.

Firstly, as shown in FIG. 4G, the sheet elastomer 26 which is processed into a predetermined shape is adhered to the solder resist 22 by means of heating and loading and thereafter, as shown FIG. 4H, the semiconductor device 28 is aligned and bonded with the elastomer 26 by means of heating and loading.

Next, heat, load and ultrasonic waves are applied to a tool 40 shown in FIG. 4I to carry out inner bonding (in the direction of the arrow T) in the bonding hole 12b to bond the inner leads 18 to the electrode pads 30. In addition, as shown in FIG. 5J, the inner bonding portion is sealed with resin 32 and, as shown in FIG. 5K, solder balls 20 are mounted on the top faces of the lands 17. Heat is then applied thereby welding the contact portion. Finally, as shown in FIG. 5L, the product portion is punched out of the tape carrier to complete the semiconductor package 10 having a BGA structure.

As explained above, in the process for the production of a semiconductor package according to this embodiment, after the lands 17 are formed on the base substrate 12, the solder resist 22 is formed to eliminate the step between the lands 17 and the bottom face of the base substrate 12, which step is produced by the land 17. Then, the sheet elastomer 26 is bonded to the bottom face portion of the base substrate 12 which has been smoothed by the solder resist 22, specifically, to the solder resist 22.

Accordingly, no gap or the like is produced at the joint surface of the elastomer 26 which is brought into surface contact with the solder resist 22 and no partial peeling force is produced. As a consequence, there is no space caused by the partial peeling is not produced on the joint surface. Also, the package is not deformed and no crack is produced even if heat history is applied to the semiconductor package 10 produced in the above manner.

Second Embodiment

Next, a second embodiment of the present invention will be explained. The structure of the second embodiment is substantially the same as that explained in the first embodiment. Therefore, the same structural parts are represented by the same symbols and explanations of these structures are omitted. The second embodiment relates to the structure of the arrangement of a semiconductor device.

Figure 6A:
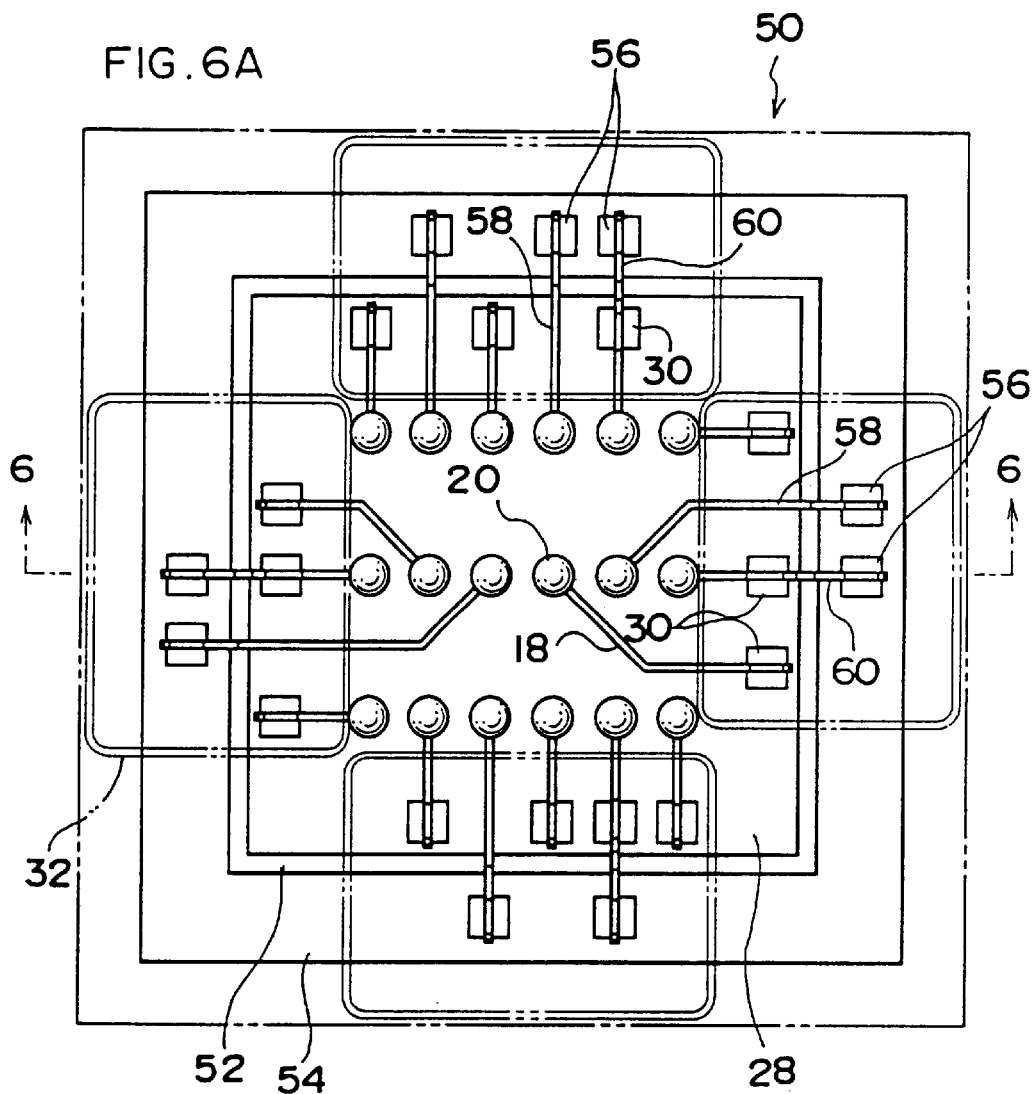
Figure 6B:
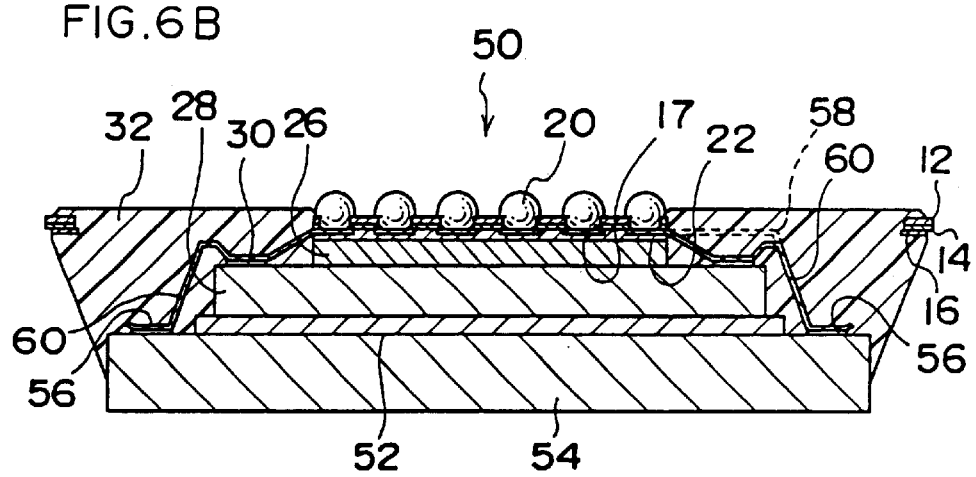

FIGS. 6A and 6B show a semiconductor package 50 according to the second embodiment of the present invention. In the semiconductor package 50, a semiconductor device 54 having an outside dimension slightly larger than that of a semiconductor device 28 is fixed to the bottom face of the semiconductor device 28 by an adhesive 52. Electrode pads 56 are formed on the peripheral portion of the top face of the semiconductor device 54 in the same way as the semiconductor device 28.

The electrode pads 56 of the semiconductor device 54 are connected to the lands 17 by inner leads 58 (bent once in the vertical direction (of the height)) which connect the lands 17 directly to the electrode pads 56, and by inner leads 60 (bent several times in the vertical direction (of the height)) which connect the lands 17 to the electrode pads 56 via electrode pads 30.

A "single point bonding method using a combination of ultrasonic wave, heat and load" is used as the method of bonding the inner lead to the electrode pad 56, as is the case with the inner leads 18 of the semiconductor device 28 (first embodiment). Note that in the case of the inner lead 60 which is bonded at two locations, the upper electrode pad 30 is bonded secondly after the lower electrode pad 56 has been bonded. Thus, the semiconductor devices 28 and 54 are electrically connected to each other in the semiconductor package 50 by the inner lead 60.

Note here that a combination of semiconductors, each having a different function may be used. Namely, a combination such as one in which the upper semiconductor device 28 is a logic based semiconductor device and the lower semiconductor device 54 is a memory based semiconductor device is possible. It is needless to say that possible combinations of semiconductor devices are not limited to the above, but may include diverse combinations such as a combination of the same logic types or the same memory types, making it possible to increase the functions of the semiconductor package.

As outlined above, in the semiconductor package 50 of this embodiment, a plurality of semiconductor devices are provided in the semiconductor package and connected electrically to each other. Namely, the semiconductor package 50 has the structure in which the semiconductor device 28 and the semiconductor device 54 are disposed in the same package and share the package and the lands 17. Moreover, because the semiconductor devices 28 and 54 are arranged in a stack, specifically, one is placed on top of the other in the direction of the thickness, the outside dimension of the semiconductor package 50 in the direction of the packaged plane is smaller than if both semiconductor devices were placed side by side on the same plane.

This decreases the packaging space and improves the packaging density as compared with the case of packaging, within a given area, a plurality of semiconductor packages having the conventional structure in which one semiconductor device is stored in one package.

Also, the connecting paths between semiconductor devices are shorter than in the conventional case where semiconductor packages are electrically connected through external paths such as a substrate pattern. This is advantageous in the prevention of delays in signal transmission time.

Third Embodiment

Next, a third embodiment of the present invention will be explained. The structure of the third embodiment is substantially the same as that explained in the first or second embodiment. Therefore, the same structural parts are represented by the same symbols and explanations of these structures are omitted. The third embodiment relates to the structure of the connection of a semiconductor device of the second embodiment.

Figure 7A:
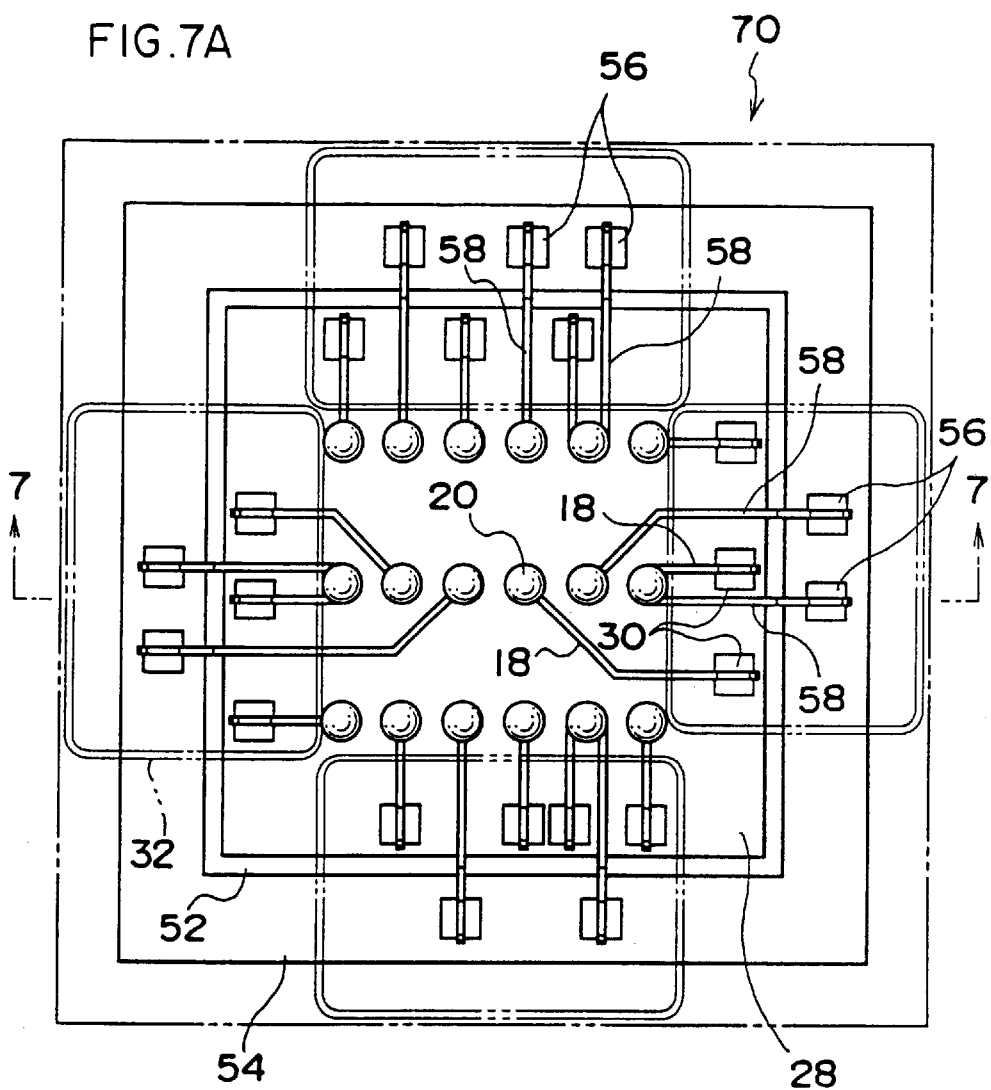
Figure 7B:
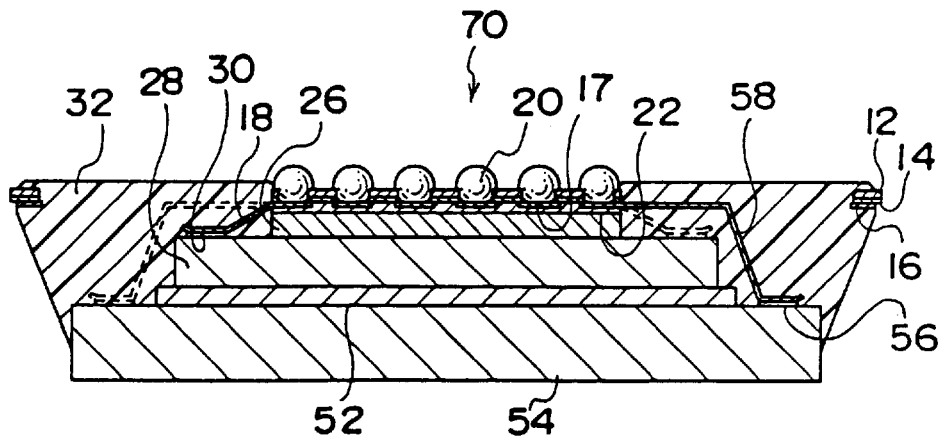

FIGS. 7A and 7B show a semiconductor package 70 according to the third embodiment of the present invention. The semiconductor package 70 has the structure in which semiconductor devices 28 and 54 are connected to each other through inner leads 18 and 58 formed in the same land 17. Unlike the second embodiment, the inner lead 60 bonded at two locations is not used. Instead, each semiconductor device is electrically connected directly to a land 17.

This avoids the necessity for a complicated structure and method such as the bridge-like connection between semiconductor devices 28 and 54 simplifying the bonding process.

Fourth Embodiment

Next, a fourth embodiment of the present invention will be explained. The structure of the fourth embodiment is almost the same as that explained in the first embodiment. Therefore, the same structural parts are represented by the same symbols and explanations of these structures are omitted. The fourth embodiment relates to the structure of the arrangement of a semiconductor device which is different from those of the second and third embodiments.

Figure 8:
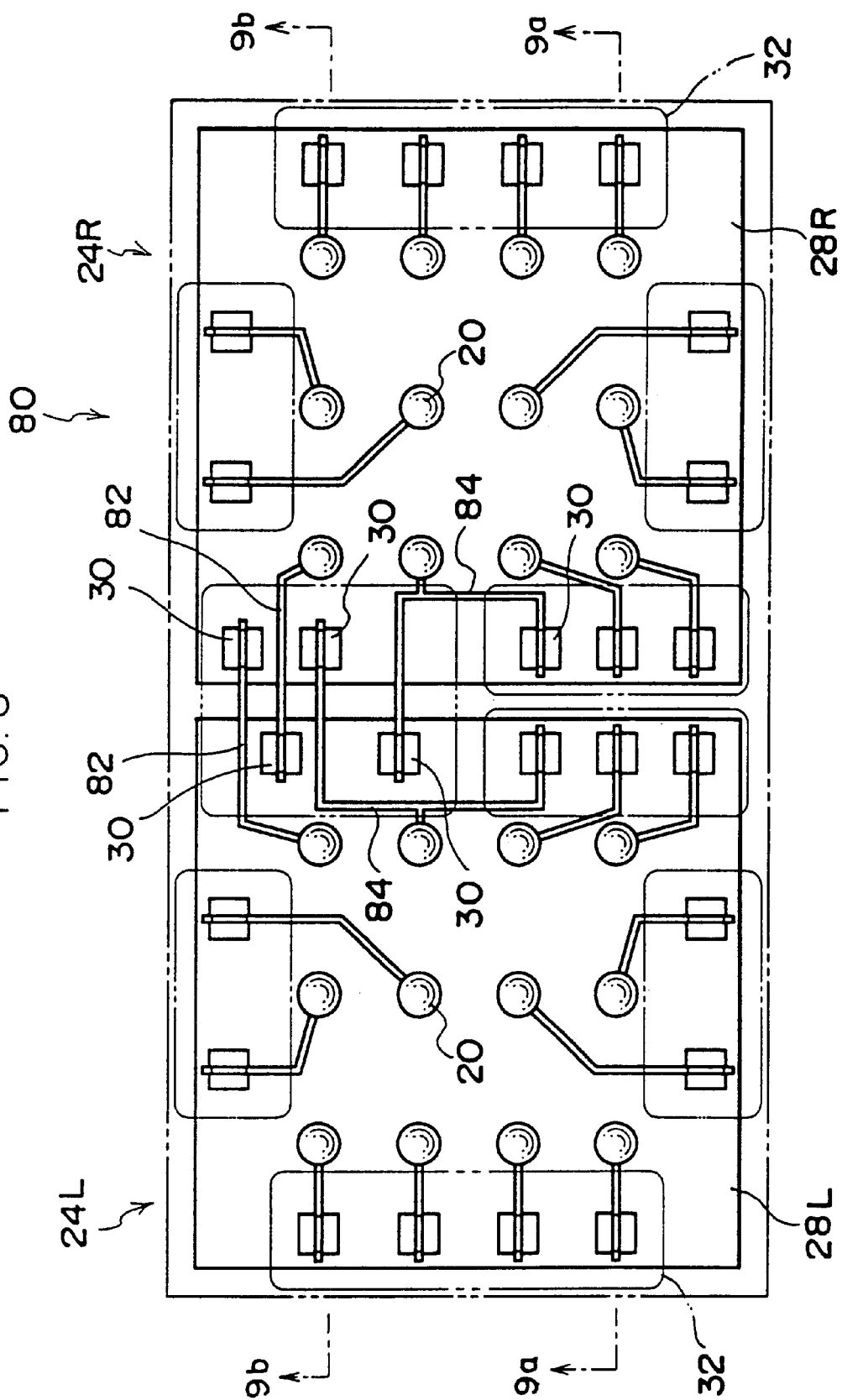
FIG. 8 is a plan view showing a semiconductor package with a BGA structure according to a fourth embodiment of the present invention.
Figure 9A:
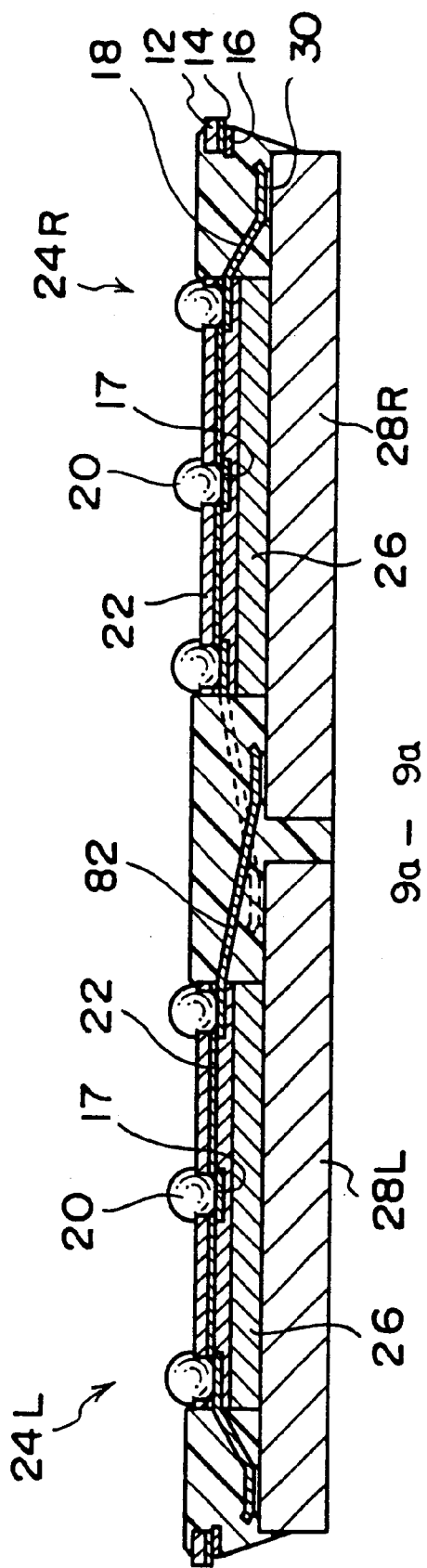
Figure 9B:
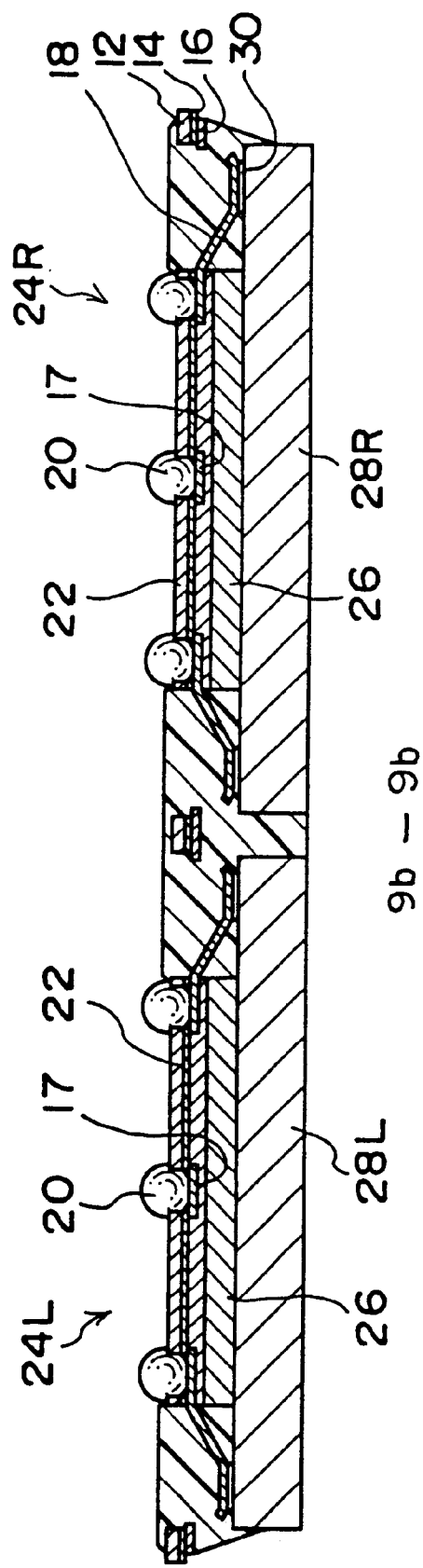
Figure 10A:
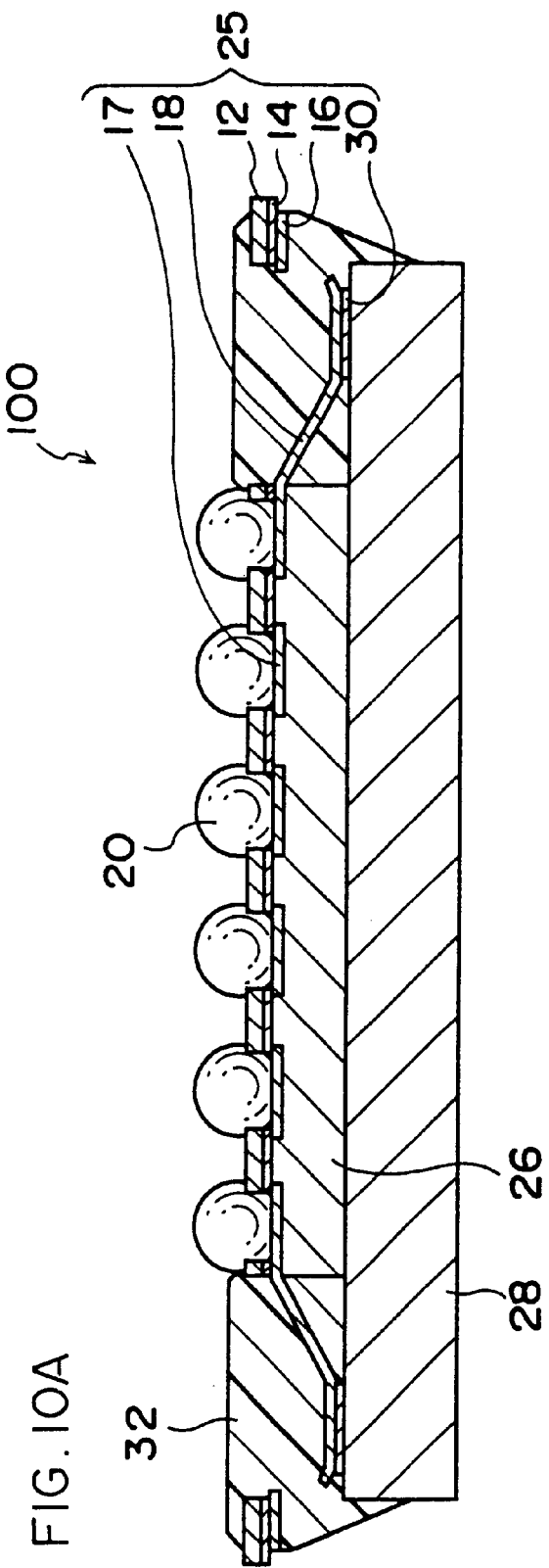
FIGS. 10A and 10B are schematic sectional views showing a conventional semiconductor package with a BGA structure.
Figure 10B:
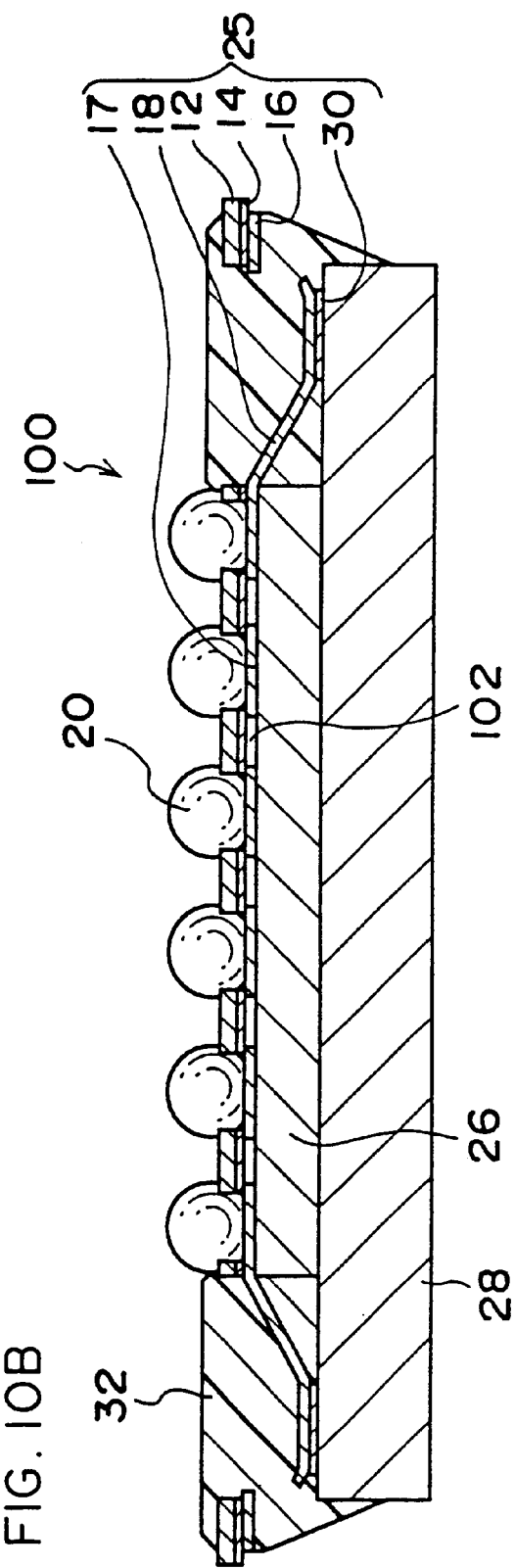

FIG. 8 and FIGS. 9A and 9B show a semiconductor package 80 according to the fourth embodiment of the present invention. In the semiconductor package 80, two tape carriers are placed side by side on the same plane and are each provided with a semiconductor device having substantially the same outside dimension and thickness. Here, semiconductor devices 28L and 28R are loosely fixed to a tape carrier 24L on the left and to a tape carrier 24R on the right respectively by an elastomer 26. These semiconductor devices 28L and 28R are respectively bonded to an electrode pad 30 by a land 17 and an inner lead 18 formed in each of the tape carriers 24L and 24R.

Moreover, an inner lead 82 bonded to the adjacent semiconductor device and an inner lead 84, which branches into two directions partway along its length with one end of each branch being connected to each of the semiconductor devices 28L and 28R, are formed extending from a part of each land 17 located in the portions of each tape carrier 24L and 24R adjacent to each other. The inner lead 84 therefore serves to connect these semiconductor devices 28L and 28R to each other.

In the semiconductor package 80, since the semiconductor devices are placed side by side on the same plane, the semiconductor package can be made thinner than in the case of the stacked arrangement and the packaging area is reduced even when compared with conventional arrangement in which semiconductor packages are placed side by side on the same plane and packaged. Accordingly, when this invention is applied to, for instance, thinly made equipment, the packaging density is improved over semiconductor packages having conventional structures.

When semiconductor devices are arranged in parallel in the above manner, they can be stored in one package irrespective of their size.

Note that although two semiconductor devices were used in the semiconductor package in the aforementioned second, third and fourth embodiments, the number of semiconductor devices to be arranged is not limited to this and the present invention may be applied even where three or more semiconductor devices are used.

Further, all of these embodiments may be applied to a semiconductor package having a BGA structure using gold wire or the like for the inner lead used as wiring to connect a land to a semiconductor device.

Because the semiconductor package and the process for the production of the semiconductor package according to the present invention are designed to have the above structures, neither deformation nor cracks of the package will be produced even if heat history is applied in packaging, and during packaging, the packaging density can be improved above that of conventional structures.

What is claimed is:

1. A semiconductor package, the package comprising:
   (a) a base substrate having a perforation formed therein, the perforation including a bottom and the base substrate including a backface;
   (b) an electrode portion secured to the backface of the base substrate and disposed on the bottom of the perforation, wherein a gap exists between the base substrate and the electrode portion;
   (c) a semiconductor device electrically connected to the electrode portion and disposed on the backface of the base substrate;
   (d) a sheet elastic body interposed between the semiconductor device and the electrode portion; and
   (e) a leveling material filling the gap between the base substrate and the electrode portion.

2. A semiconductor package according to claim 1, wherein the base substrate is a polyimide film and the leveling material is an insulating coating agent.

3. A semiconductor package according to claim 1, wherein there is a plurality of semiconductor devices connected to the base substrate and electrically connected to the electrode portion.

4. A semiconductor package according to claim 3, wherein the plurality of semiconductor devices are connected to the base substrate in a stacked arrangement.

5. A semiconductor package according to claim 4, wherein the stacked arrangement includes a top semiconductor device on which the electrode portion is disposed, and each semiconductor device is electrically connected directly to the electrode portion.

6. A semiconductor package according to claim 3, wherein the plurality of semiconductor devices are connected to the base substrate in a planar arrangement.

7. A semiconductor package according to claim 3, wherein the plurality of semiconductor devices are arranged in combination stacked and planar arrangement.

8. A semiconductor package, the package comprising:
   (a) a base substrate having a perforation formed therein, the perforation including a bottom and the base substrate including a backface;
   (b) an electrode portion secured to the backface of the base substrate and disposed on the bottom of the perforation;
   (c) a semiconductor device electrically connected to the electrode portion and disposed on the backface of the base substrate;
   (d) a sheet elastic body interposed between the semiconductor device and the electrode portion; and
   (e) leveling means between the base substrate and the electrode portion for eliminating gaps along the electrode portion.

9. A semiconductor package according to claim 8, wherein the base substrate is a polyimide film and the leveling means includes an insulating coating agent.

10. A semiconductor package according to claim 8, wherein there is a plurality of semiconductor devices connected to the base substrate and electrically connected to the electrode portion.

11. A semiconductor package according to claim 10, wherein the plurality of semiconductor devices are connected to the base substrate in a stacked arrangement.

12. A semiconductor package according to claim 11, wherein the stacked arrangement includes a top semiconductor device on which the electrode portion is disposed, and each semiconductor device is electrically connected directly to the electrode portion.

13. A semiconductor package according to claim 10, wherein the plurality of semiconductor devices are connected to the base substrate in a planar arrangement.

14. A semiconductor package according to claim 10, wherein in the plurality of semiconductor devices, at least one of the semiconductor devices lies above another semiconductor device, and at least one of the semiconductor devices lies at the same level as another semiconductor device.

* * * * *